(12) United States Patent
Wang

(10) Patent No.: US 12,051,737 B2
(45) Date of Patent: Jul. 30, 2024

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 326 days.

(21) Appl. No.: 17/446,240

(22) Filed: Aug. 27, 2021

(65) Prior Publication Data

US 2022/0077304 A1 Mar. 10, 2022

(30) Foreign Application Priority Data

Sep. 8, 2020 (CN) .......................... 202010937377.5

(51) Int. Cl.
| | |
|---|---|
| *H01L 21/768* | (2006.01) |
| *H01L 21/67* | (2006.01) |
| *H01L 21/8234* | (2006.01) |
| *H01L 27/088* | (2006.01) |
| *H01L 29/06* | (2006.01) |
| *H01L 29/66* | (2006.01) |
| *H01L 29/78* | (2006.01) |

(52) U.S. Cl.
CPC .. *H01L 29/66795* (2013.01); *H01L 21/67075* (2013.01); *H01L 21/823412* (2013.01); *H01L 21/823418* (2013.01); *H01L 21/823431* (2013.01); *H01L 21/823481* (2013.01); *H01L 27/0886* (2013.01); *H01L 29/0649* (2013.01); *H01L 29/66545* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 2021/0057276 A1* | 2/2021 | Liu | ................. | H01L 29/66795 |
| 2021/0126099 A1* | 4/2021 | Young | ............... | H01L 29/66439 |

* cited by examiner

*Primary Examiner* — Joseph C. Nicely
*Assistant Examiner* — Lamont B Koo
(74) *Attorney, Agent, or Firm* — Anova Law Group, PLLC

(57) ABSTRACT

Semiconductor device and fabrication method are provided by providing initial fins discretely arranged on a substrate; forming an isolation structure on the substrate; forming a connecting layer on sidewalls of the initial fins and between adjacent initial fins; forming a dummy gate structure across the initial fins and the connecting layer on the substrate, covering sidewalls of the connecting layer and a portion of a top surface of the initial fins; forming grooves in the initial fins on both sides of the dummy gate structure, and forming source and drain doped layers in the grooves; forming a dielectric layer on the substrate, covering sidewalls of the dummy gate structure and the source and drain doped layers, that a top surface of the dielectric layer is flush with a top surface of the dummy gate structure; and removing the dummy gate structure to form a gate structure.

20 Claims, 11 Drawing Sheets

SEMICONDUCTOR DEVICE AND FABRICATION METHOD THEREOF

CROSS-REFERENCE TO RELATED APPLICATION

This application claims the priority of Chinese Patent Application No. 202010937377.5, filed on Sep. 8, 2020, the content of which is incorporated herein by reference in its entirety.

TECHNICAL FIELD

The present disclosure generally relates to the field of semiconductor manufacturing and, more particularly, to a semiconductor device and a fabrication method of the semiconductor device.

BACKGROUND

A metal-oxide-semiconductor field effect transistor (MOSFET) is one of the most important components in modern integrated circuits. A basic structure of the MOSFET includes: a semiconductor substrate; a gate structure on a surface of the semiconductor substrate, that the gate structure includes: a gate dielectric layer on the surface of the semiconductor substrate and a gate electrode layer on a surface of the gate dielectric layer; and source and drain doped regions in the semiconductor substrate on both sides of the gate structure.

With development of semiconductor technology, a traditional planar MOSFETs ability to control a channel current becomes weaker, causing a serious leakage current. A fin field effect transistor (Fin FET) is an emerging multi-gate device, which generally includes fins protruding from a surface of a semiconductor substrate, a gate structure covering a portion of a top surface and sidewalls of the fins; and source and drain doped regions in the fins on both sides of the gate structure. Compared with the planar MOSFET, the Fin FET has a stronger short channel suppression ability and a higher operating current.

With further development of the semiconductor technology, the traditional Fin FET has limitations in further increasing the operating current. Specifically, since only regions close to the top surface and the sidewalls of the fins are used as channel regions, a volume of the fins used as the channel regions is small, which causes restrictions on increasing the operating current of the Fin FET. Therefore, a MOSFET with a gate-all-around (GAA) structure has been proposed, so that the volume used as the channel regions is increased, thereby further increasing the operating current of the MOSFET with the GAA structure.

However, in the existing technologies, electrical performance of the MOSFET with the GAA structure still needs to be improved.

SUMMARY

One aspect of the present disclosure provides a fabrication method of a semiconductor device, including: providing a plurality of initial fins discretely arranged on a substrate; forming an isolation structure on the substrate; forming a connecting layer on sidewalls of the plurality of initial fins and between adjacent initial fins; forming a dummy gate structure across the plurality of initial fins and the connecting layer on the substrate, that the dummy gate structure covers sidewalls of the connecting layer and a portion of a top surface of the plurality of initial fins; forming grooves in the plurality of initial fins on both sides of the dummy gate structure, and forming source and drain doped layers in the grooves; forming a dielectric layer on the substrate, that the dielectric layer covers sidewalls of the dummy gate structure and the source and drain doped layers, and a top surface of the dielectric layer is flush with a top surface of the dummy gate structure; and removing the dummy gate structure to form a gate structure.

Optionally, the connecting layer is made of a material including silicon germanium, amorphous carbon, amorphous germanium, or a combination thereof.

Optionally, a process of forming the connecting layer is a chemical vapor deposition process, an atomic layer deposition process, a physical vapor deposition process, or an epitaxial growth process.

Optionally, forming the connecting layer includes: forming an initial connecting layer on the substrate, on the sidewalls and tops of the initial fins, and between adjacent initial fins; and etching back the initial connecting layer to expose the substrate and the top surface of the initial fins to form the connecting layer.

Optionally, forming the plurality of initial fins discretely arranged on the substrate includes: forming a patterned layer on the substrate; and using the patterned layer as a mask, etching a portion of a thickness of the substrate to form the plurality of initial fins discretely arranged on the substrate.

Optionally, forming the plurality of initial fins discretely arranged on the substrate includes: forming sacrificial layer films and channel layer films alternately stacked on the substrate, that the channel layer films are located between two adjacent sacrificial layer films and on a top sacrificial layer film; forming a patterned layer on a top channel layer film; and using the patterned layer as a mask, etching the channel layer films, the sacrificial layer films, and a portion of a thickness of the substrate to form the initial fins on the substrate, that the initial fins include sacrificial layers and channel layers alternately stacked along a normal direction of a surface of the substrate, and the channel layers are located between two adjacent sacrificial layers and on a top sacrificial layer.

Optionally, removing the dummy gate structure to form the gate structure includes: removing the dummy gate structure, the sacrificial layers under the dummy gate structure, and the connecting layer, to form a gate opening and conduits, that the conduits are located between adjacent channel layers and between the channel layers and the substrate; and forming the gate structure in the gate opening and in the conduits, that the gate structure fills the gate opening and the conduits, and surrounds the channel layers.

Optionally, before forming the connecting layer, the method further includes: forming a hard mask layer on the tops of the initial fins.

Optionally, before forming the source and drain doped layers, the method further includes: etching a portion of the sacrificial layers on sidewalls of the grooves, to form barrier layers on sidewalls of the etched sacrificial layers.

Optionally, a top surface of the isolation structure is flush with a bottom surface of a bottom sacrificial layer.

Another aspect of the present disclosure provides a semiconductor device, including: a substrate; a plurality of fins discretely arranged on the substrate; and a gate structure across the plurality of fins, that each fin of the plurality of fins includes one or more channel layers spaced apart from each other, and each of the one or more channel layers is surrounded by the gate structure, that the gate structure is formed by: providing a plurality of initial fins discretely arranged on the substrate; forming an isolation structure on the substrate and between adjacent initial fins; forming a connecting layer on sidewalls of the plurality of initial fins and between adjacent initial fins; forming a dummy gate structure across the plurality of initial fins and the connecting layer on the substrate, that the dummy gate structure covers sidewalls of the connecting layer and a portion of a top surface of the plurality of initial fins; forming grooves in the plurality of initial fins on both sides of the dummy gate structure, and forming source and drain doped layers in the grooves; forming a dielectric layer on the substrate, that the dielectric layer covers sidewalls of the dummy gate structure and the source and drain doped layers, and a top surface of the dielectric layer is flush with a top surface of the dummy gate structure; and removing the dummy gate structure to form the gate structure.

Compared with existing technologies, the technical solution of the present disclosure has the following advantages.

After forming the plurality of initial fins discretely arranged on the substrate, the connecting layer is formed on the sidewalls of the initial fins and between adjacent initial fins, and the connecting layer is used to connect the discretely arranged initial fins to be a whole. The dummy gate structure across the initial fins and the connecting layer is formed on the substrate. The dummy gate structure covers the sidewalls of the connecting layer and a portion of the top surface of the initial fins, that is, the dummy gate structure is across the entire connected initial fins, instead of spanning the plurality of discretely arranged initial fins, to avoid forming the dummy gate structure between the initial fins. As a result, on one hand, it is convenient to remove the dummy gate structure in a process of removing the dummy gate structure, and reduce residue of the dummy gate structure, thereby improving the quality of the formed gate structure. On another hand, because the plurality of discretely arranged initial fins is connected to be a whole, during a process to form gate structure sidewall spacers, a sidewall spacer material will not be formed between the initial fins, formation difficulty of the gate structure sidewall spacers is reduced in a process of etching the sidewall spacer material to form the sidewall spacers, and formation quality of the gate structure sidewall spacers is improved, thereby helping to improve quality of a final semiconductor device.

BRIEF DESCRIPTION OF THE DRAWINGS

The following accompanying drawings are merely examples for illustrative purposes according to various disclosed embodiments and are not intended to limit the scope of the present disclosure.

DETAILED DESCRIPTION

Figure 1:
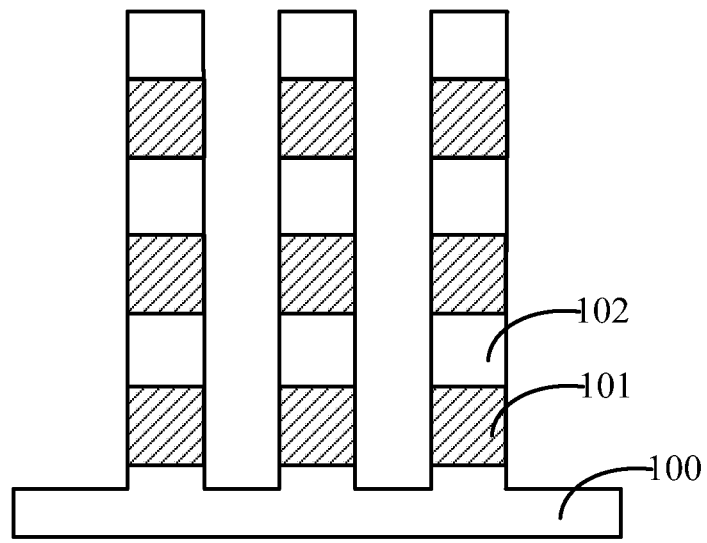
FIGS. 1 to 3 are structural schematic diagrams of an existing pattern structure fabrication process.
Figure 2:
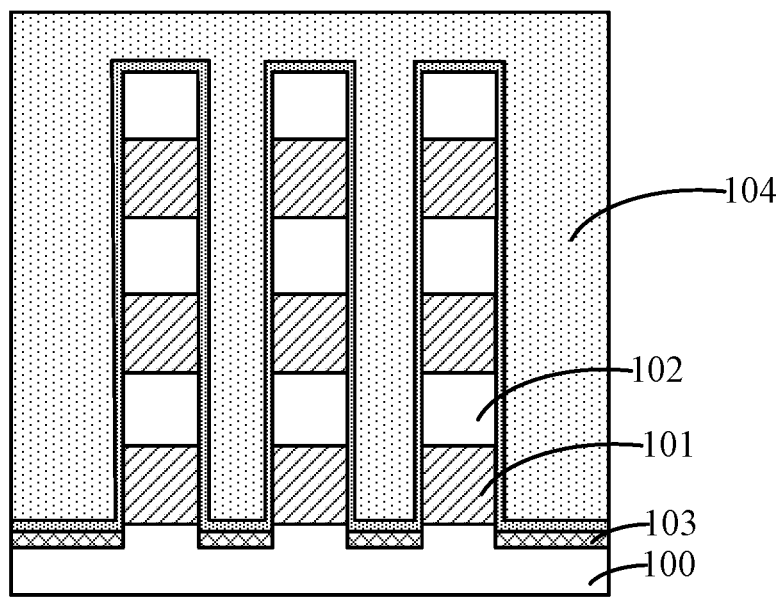
Figure 3:
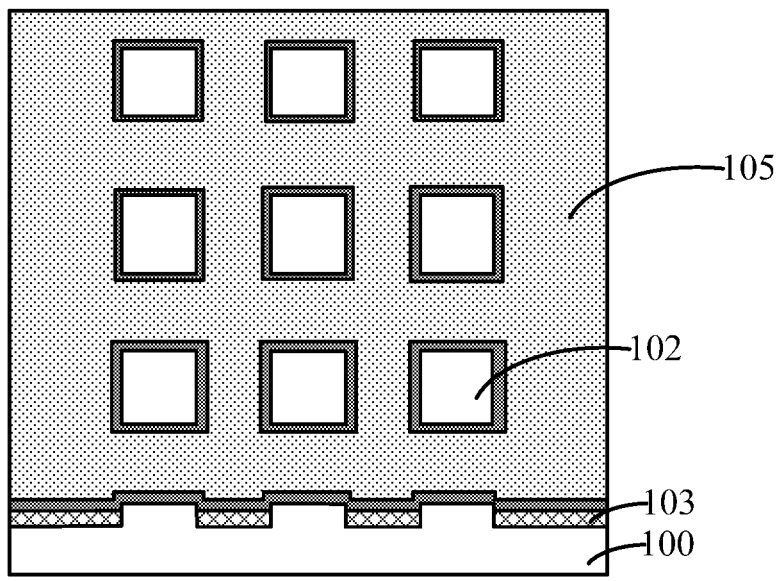

As a size of semiconductor devices is reduced, spacings between fins become smaller and smaller. But as the spacings between the fins become smaller and smaller, there are some difficulties in a process of forming a MOSFET with a GAA structure. FIGS. 1 to 3 can be referred to for an alternative process.

FIGS. 1 to 3 are structural schematic diagrams of an existing pattern structure fabrication process.

Referring to FIG. 1, a substrate 100 is provided. A plurality of discretely arranged initial fins is formed on the substrate 100. The initial fins include sacrificial layers 101 and channel layers 102 alternately stacked along a normal direction of a surface of the substrate 100. The channel layers 102 are located between two adjacent sacrificial layers 101 and on a top sacrificial layer 101.

Referring to FIG. 2, an isolation structure 103 is formed on the substrate 100. The isolation structure 103 covers a portion of sidewalls of the initial fins. A dummy gate structure 104 is formed on the substrate 100 across the plurality of discretely arranged initial fins. The dummy gate structure 104 covers a portion of a top surface of the initial fins and a portion of the sidewalls of the initial fins.

Referring to FIG. 3, the dummy gate structure 104 and the sacrificial layers 101 covered by the dummy gate structure 104 are removed to form a gate structure 105. The gate structure 105 surrounds the channel layers 102.

After forming the dummy gate structure 104, processes such as forming gate sidewall spacers on sidewalls of the dummy gate structure 104, and then forming source and drain doped layers in the initial fins on both sides of the dummy gate structure 104, etc., are also included, and are not shown here.

After forming the dummy gate structure 104 in the above method, in a process of removing the dummy gate structure to form the gate structure 105, on one hand, due to small spacings between the initial fins, residue of the dummy gate structure is easily caused in the process of removing the dummy gate structure; and at the same time, since the spacings between the initial fins are reduced, difficult to form the gate sidewall spacers is increased. On another hand, due to different spacings between the initial fins, in a process of forming the isolation structure, stresses that the initial fins can withstand are caused to be different, which causes a portion of the initial fins to bend, thereby affecting quality and performance of a final formed semiconductor device.

To solve the above problems, various embodiments of the present disclosure provide a fabrication method of a semiconductor device. After forming a plurality of initial fins discretely arranged on a substrate, a connecting layer is formed on sidewalls of the initial fins and between adjacent initial fins. The connecting layer is used to connect the plurality of discretely arranged initial fins into a fin with a width. On one hand, it facilitates removing a dummy gate structure during a subsequent process to form a gate structure, and reducing residue of the dummy gate structure, thereby improving quality of the formed gate structure. On another hand, because the plurality of discretely arranged initial fins is connected to form the fin with the width, in a process of forming gate structure sidewall spacers, formation difficulty of the gate structure sidewall spacers is reduced, and formation quality of the gate structure sidewall spacers is improved, thereby helping to improve quality of a final formed semiconductor device.

To make the above objectives, features and advantages of the present disclosure more obvious and understandable, alternative embodiments of the present disclosure will be described in detail below with reference to the accompanying drawings.

FIGS. 4 to 18 illustrate structures corresponding to certain stages during an exemplary fabrication process of a semiconductor device consistent with various disclosed embodiments of the present disclosure.

Figure 19:
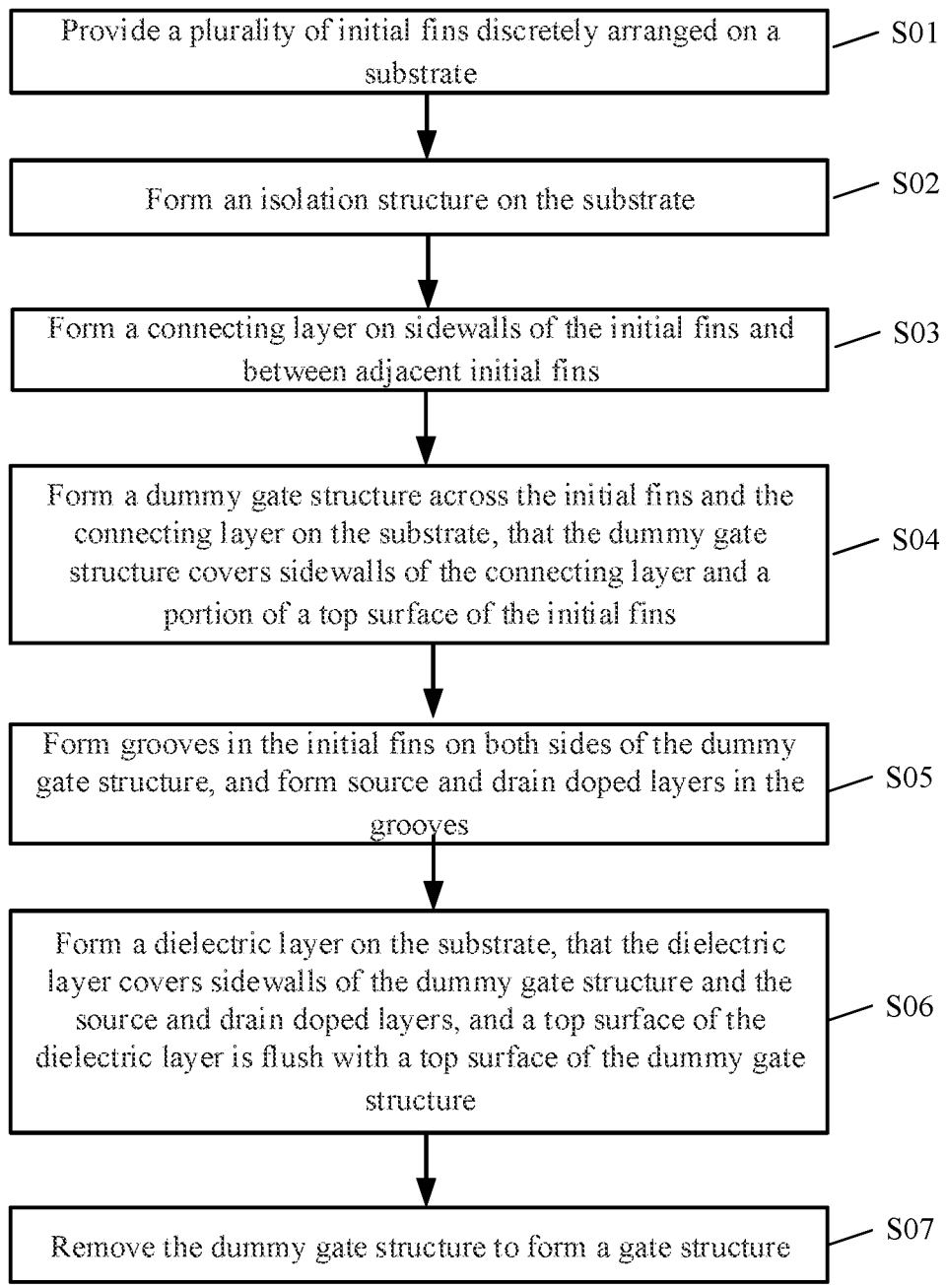
FIG. 19 illustrates an exemplary fabrication process of a semiconductor device consistent with various disclosed embodiments of the present disclosure.

FIG. 19 illustrates an exemplary fabrication process of a semiconductor device consistent with various disclosed embodiments of the present disclosure.

Figure 4:
FIGS. 4 to 18 illustrate structures corresponding to certain stages during an exemplary fabrication process of a semiconductor device consistent with various disclosed embodiments of the present disclosure.

Referring to FIG. 4, a substrate 200 is provided according to S01 in FIG. 19.

In one embodiment, the substrate 200 is made of a material including monocrystalline silicon.

In other embodiments, the substrate 200 may also be made of a material including polysilicon, amorphous silicon, or a combination thereof. In other embodiments, the substrate 200 may also be made of a semiconductor material such as germanium, silicon germanium, gallium arsenide, silicon-on-insulator (SOI), germanium-on-insulator (GOI), etc., or a compound semiconductor material including one or more Group III-V elements. The Group III-V element includes, for example, InP, GaAs, GaP, GaN, InAs, InSb, InGaAs, and/or InGaAsP.

Figure 5:
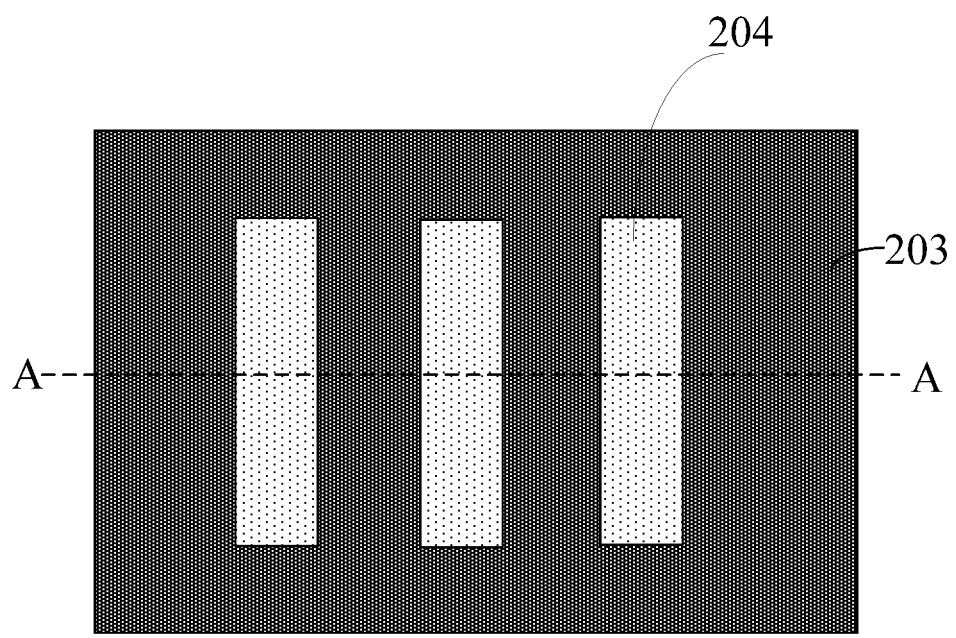
Figure 6:
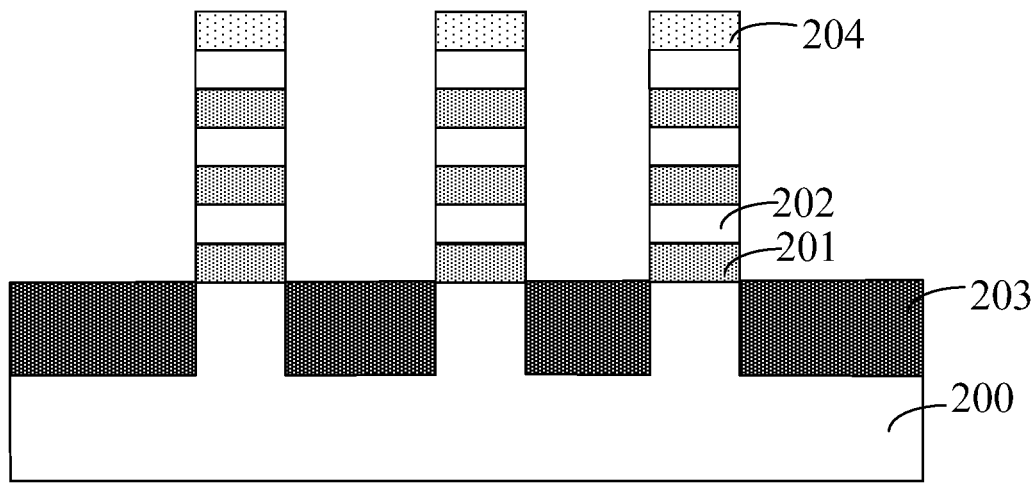

FIG. 5 is a top view of FIG. 6, and FIG. 6 is a schematic cross-sectional view taken along a line A-A in FIG. 5. Referring to FIGS. 5 and 6, a plurality of initial fins arranged in parallel is formed on the substrate 200. The initial fins include a plurality of sacrificial layers 201 and a plurality of channel layers 202 alternately stacked along a normal direction of a surface of the substrate 200. The plurality of channel layers 202 is located between two adjacent sacrificial layers 201, and on a top sacrificial layer 201.

In FIGS. 5 and 6, a number of the initial fins is three, a number of layers of the sacrificial layers 201 is three, and a number of layers of the channel layers 202 is three.

In one embodiment, forming the plurality of initial fins discretely arranged on the substrate 200 include: forming sacrificial layer films (not shown in FIGS. 5 and 6) and channel layer films (not shown in FIGS. 5 and 6) alternately stacked on the substrate, that the channel layer films are located between two adjacent sacrificial layer films and on a top sacrificial layer film; forming a patterned layer (not shown in FIGS. 5 and 6) on a top channel layer film; and by using the patterned layer as a mask, etching the channel layer films, the sacrificial layer films, and a portion of a thickness of the substrate, to form the initial fins on the substrate. The initial fins include the plurality of sacrificial layers 201 and the plurality of channel layers 202 alternately stacked along the normal direction of the surface of the substrate 200. The plurality of channel layers 202 is located between two adjacent sacrificial layers 201, and on the top sacrificial layer 201.

In one embodiment, the sacrificial layer films and the channel layer films alternately stacked on the substrate are formed, the patterned layer is formed on the top channel layer film, and by using the patterned layer as the mask, the channel layer films, the sacrificial layer films, and the portion of the thickness of the substrate, are etched to form the initial fins on the substrate, so that the initial fins include the sacrificial layers 201 and the channel layers 202. A purpose of above processes is that, in a subsequent process of forming a gate structure, the sacrificial layers 201 need to be removed, so that the gate structure can occupy positions of the sacrificial layers 201, therefore the gate structure can surround peripheral sidewalls of the channel layers 202. As a result, an effective width of the gate structure and control ability to the channel layers 202 can be enhanced, thereby helping to improve quality of a formed semiconductor device.

In other embodiments, forming the plurality of initial fins arranged in parallel on the substrate 200 include: forming a patterned layer on the substrate; and by using the patterned layer as a mask, etching a portion of a thickness of the substrate to form the plurality of initial fins discretely arranged on the substrate.

In one embodiment, the sacrificial layers 201 and the channel layers 202 are made of different materials. The sacrificial layers 201 need to be removed when the gate structure is subsequently formed. Therefore, the sacrificial layers 201 and the channel layers 202 of different materials have a larger etching selection ratio, and damage to the channel layers 202 can be reduced during a process of removing the sacrificial layers 201.

In one embodiment, the sacrificial layers 201 are made of a material including silicon germanium, and the channel layers 202 are made of a material including monocrystalline silicon.

In other embodiments, the sacrificial layers 201 and the channel layers 202 may also be made of a semiconductor material including silicon carbide, gallium arsenide, indium gallium arsenide, a compound semiconductor material including one or more Group III-V elements, or a combination thereof. The Group III-V element includes, for example, InP, GaAs, GaP, GaN, InAs, InSb, InGaAs, and/or InGaAsP.

In one embodiment, an epitaxial growth process is used to form the sacrificial layer films. Process parameters of the epitaxial growth process include: a gas used including hydrogen ($H_2$), hydrogen chloride (HCl) gas, DCS gas, $GeH_4$ gas, and $B_2H_6$ gas, that a gas flow rate of the hydrogen ($H_2$) is between about 10 sccm and about 3000 sccm; a gas flow rate of the hydrogen chloride (HCl) gas is between about 10 sccm and about 200 sccm; a gas flow rate of the DCS gas is between about 20 sccm and about 2000 sccm; a gas flow rate of the $GeH_4$ is between about 10 sccm and about 500 sccm; a gas flow rate of the $B_2H_6$ gas is between about 5 sccm and about 600 sccm; a temperature range is between about 600° C. and about 850° C.; and a pressure range is between about 8 mtorr and about 300 mtorr.

In one embodiment, an epitaxial growth process is used to form the channel layer films. Process parameters of the epitaxial growth process include: a gas used including hydrogen ($H_2$), hydrogen chloride (HCl) gas, DCS gas, $SiH_4$ gas, and $B_2H_6$ gas, that, a gas flow rate of the hydrogen ($H_2$) is between about 10 sccm and about 3000 sccm; a gas flow rate of the hydrogen chloride (HCl) gas is between about 10 sccm and about 250 sccm; a gas flow rate of the DCS gas is between about 20 sccm and about 2500 sccm; a gas flow rate of the $SiH_4$ gas is between about 10 sccm and about 700 sccm; a gas flow rate of the $B_2H_6$ gas is between about 5 sccm and about 400 sccm; a pressure range is between about 8 mtorr and about 300 mtorr; and a temperature range is between about 600° C. and about 850° C.

In one embodiment, a reason to form the sacrificial layer films and the channel layer films by the epitaxial growth process is that the epitaxial growth process can obtain P-type and N-type materials with high conductivity, so that the sacrificial layers and the channel layers obtained have good integrity, which is conducive to forming semiconductor devices with high quality.

In other embodiments, an ion doping process or a chemical vapor deposition method may also be used to form the sacrificial layer films and the channel layer films.

In one embodiment, an isolation structure 203 is formed on the substrate 200 according to S02 in FIG. 19. A top surface of the isolation structure 203 is not higher than (that is, flush with or lower than) a top surface of the substrate 200.

In one embodiment, the top surface of the isolation structure 203 is flush with a bottom surface of a bottom sacrificial layer 201.

In one embodiment, the isolation structure 203 is made of a material including silicon nitride.

In other embodiments, the isolation structure 203 may also be made of an insulating material including silicon oxide, silicon oxynitride (SiON), silicon carbide (SiC), silicon oxycarbide (SiOC), silicon carbonitride (SiCN), carbon oxynitride silicon (SiOCN), silicon carbon nitride boride (SiCBN), etc., or a combination thereof.

In one embodiment, a function of the isolation structure 203 is to form electrical isolation.

In one embodiment, a hard mask layer 204 is also formed on the top surface of the initial fins.

In one embodiment, the hard mask layer 204 is made of a material including silicon nitride. In other embodiments, the hard mask layer 204 may also be made of a dielectric material including silicon oxide, silicon carbide, etc., or a combination thereof.

In one embodiment, a purpose of forming the hard mask layer 204 on the top surface of the initial fins is, on one hand, to facilitate subsequent protection of tops of the initial fins and prevent the initial fins from being damaged in subsequent processes. On another hand, due to existence of the hard mask layer 204, in a process of forming the initial fins, it is convenient to accurately transfer a pattern, thereby forming the initial fins with high quality.

Figure 7:
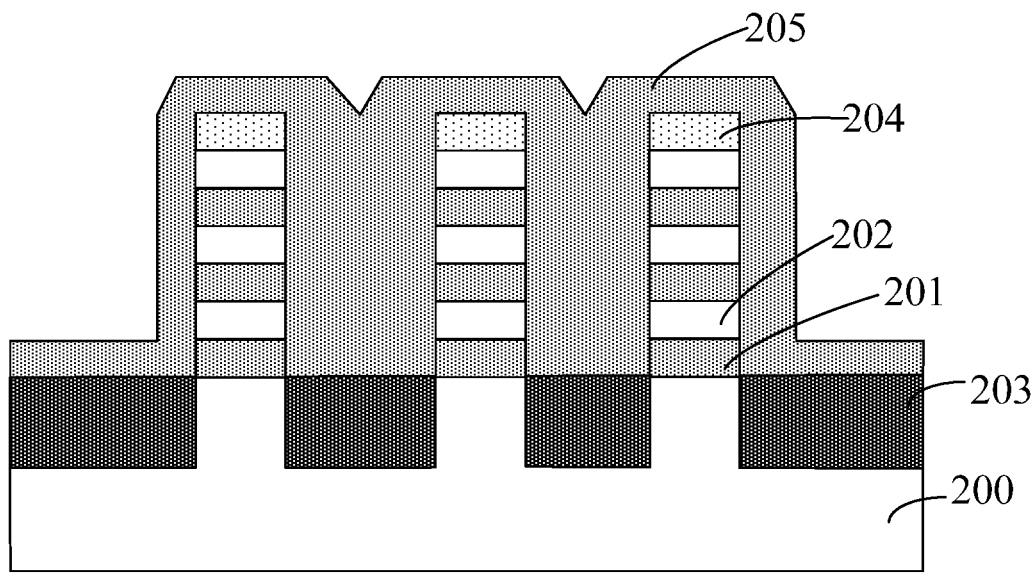
Figure 8:
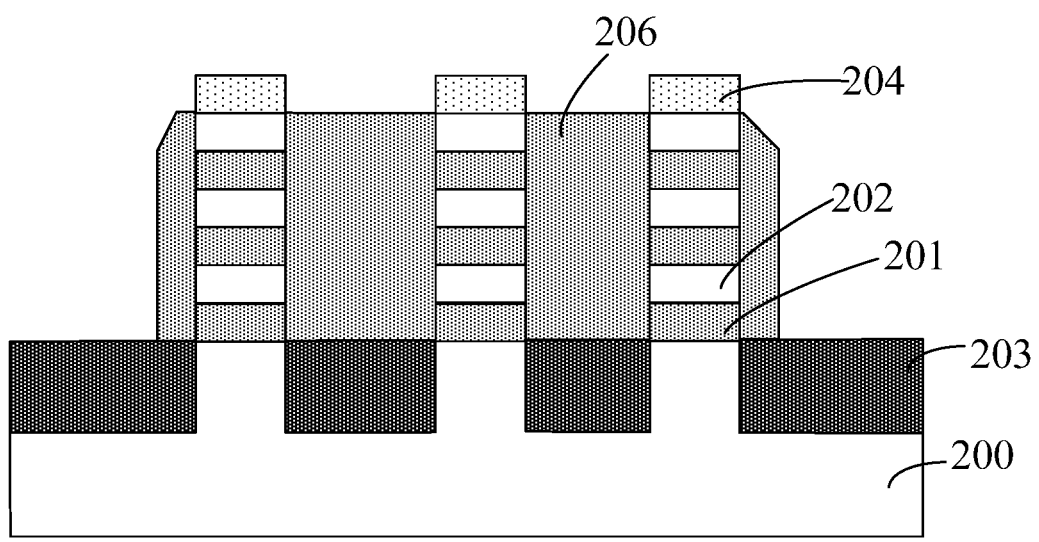

Referring to FIGS. 7 to 8, a connecting layer 206 is formed on sidewalls of the initial fins and between adjacent initial fins according to S03 in FIG. 19.

Referring to FIG. 7, an initial connecting layer 205 is formed on the substrate 200, on the sidewalls and tops of the initial fins, and between adjacent initial fins.

In one embodiment, the initial connecting layer 205 is made of a material including silicon germanium. In other embodiments, the initial connecting layer 205 may also be made of a material including amorphous carbon, amorphous germanium, or a combination thereof.

When selecting the initial connecting layer 205, an etching rate of a material of the initial connecting layer 205 is ensured to be close to an etching rate of a material of the sacrificial layers 201, and the etching rate of the initial connecting layer 205 is greater than an etching rate of the channel layers 202, to ensure that least damage to the channel layers 202 is caused in a process of removing the initial connecting layer 205, thereby ensuring quality of channels.

In one embodiment, a process of forming the initial connecting layer 205 is a chemical vapor deposition process. In other embodiments, the process of forming the initial connecting layer 205 may also be an atomic layer deposition process, a physical vapor deposition process, or an epitaxy growth process, etc.

Referring to FIG. 8, the initial connecting layer 205 is etched back until the top surface of the substrate 200 and the top surface of the initial fins are exposed, to form the connecting layer 206.

In one embodiment, the initial connecting layer 205 is etched back until the top surface of the substrate 200 and a top surface of the hard mask layer 204 are exposed, to form the connecting layer 206.

In one embodiment, a process of etching back the initial connecting layer 205 to form the connecting layer 206 is a dry etching process. In other embodiments, the process of etching back the initial connecting layer 205 to form the connecting layer 206 may also be a wet etching process.

In one embodiment, a reason for selecting the dry etching process is that the dry etching process has good etching directionality, and an etching rate in a longitudinal direction is greater than an etching rate in a lateral direction, so that in the process of etching back the initial connecting layer 205, damage to the channel layers 202 in the lateral direction can be reduced, thereby reducing the damage to the channel layers 202.

In one embodiment, the connecting layer 206 is provided between the discretely arranged initial fins, so that the discretely arranged initial fins can be regarded as a whole, therefore during a subsequent process of removing a dummy gate structure, there will be no problem of causing residue of the dummy gate structure because of the small spacings between adjacent initial fins, thereby ensuring quality of removing the dummy gate structure and improving the quality of the final gate structure.

In one embodiment, since the connecting layer 206 connects the plurality of discretely arranged initial fins into a whole, in a subsequent process of forming sidewall spacers, there are no gaps between the initial fins, so that the sidewall spacers will not be formed on the sidewalls of the initial fins, thereby reducing formation of the sidewall spacers on the sidewalls of the initial fins, and at the same time reducing the formation difficulty of the sidewall spacers, to prepare for forming semiconductor devices with high quality.

In one embodiment, after the connecting layer 206 is formed, the hard mask layer 204 is removed.

Figure 9:
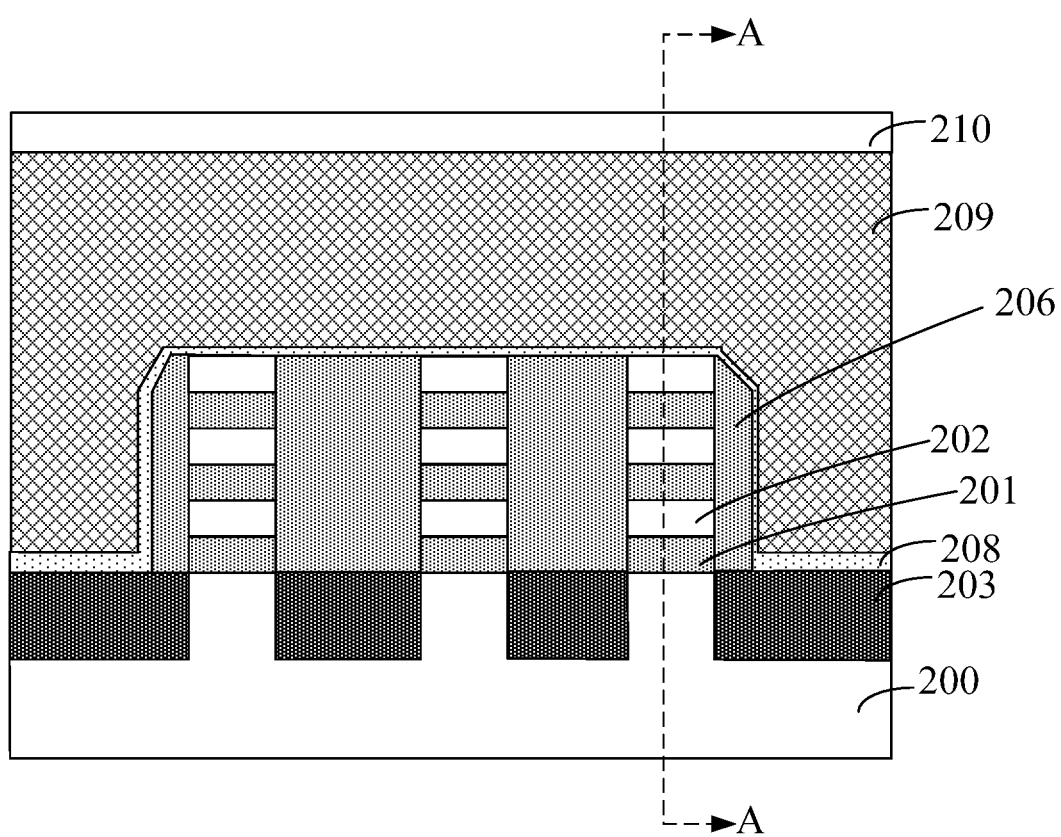
Figure 10:
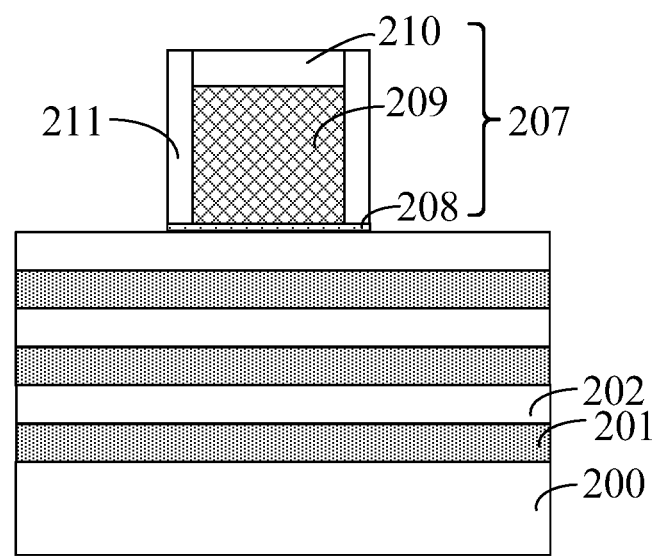

Referring to FIGS. 9 to 10, FIG. 10 is a cross-sectional view of FIG. 9 along a line A-A. Referring to FIG. 9, a dummy gate structure 207 is formed on the substrate 200 across the initial fins and the connecting layer 206 according to S04 in FIG. 19.

In one embodiment, before forming the dummy gate structure 207, the hard mask layer 204 on the tops of the initial fins is removed.

In one embodiment, the dummy gate structure 207 includes: a dummy gate dielectric layer 208 on the connecting layer 206 and the top channel layer 202, a dummy gate layer 209 on the dummy gate dielectric layer 208, and a protection layer 210 on the dummy gate layer 209.

In one embodiment, the dummy gate layer 209 is made of a material including silicon.

In one embodiment, the protection layer 210 is made of a material including silicon nitride. In other embodiments, the protection layer 210 can also be made of an insulating material including silicon oxide, silicon oxynitride (SiON), silicon carbide (SiC), silicon oxycarbide (SiOC), silicon carbonitride (SiCN), silicon oxycarbonitride (SiOCN), silicon carbonitride boride (SiCBN), etc., or a combination thereof.

In one embodiment, the method further includes: forming sidewall spacers 211 on sidewalls of the dummy gate layer 209 and sidewalls of the protection layer 210.

In one embodiment, the sidewall spacers 211 are made of a material including silicon nitride. In other embodiments, the sidewall spacers 211 can also be made of an insulating material including silicon oxide, silicon oxynitride (SiON), silicon carbide (SiC), silicon oxycarbide (SiOC), silicon carbonitride (SiCN), silicon oxycarbonitride (SiOCN), silicon carbonitride boride (SiCBN), etc., or a combination thereof.

In one embodiment, the sidewall spacers 211 are used to define positions of subsequent source and drain doped layers.

A method for forming the sidewall spacers 211 includes: forming a sidewall spacer material layer (not shown) on a top surface of the dummy gate dielectric layer 208, the sidewalls of the dummy gate layer 209, and the sidewalls and a top surface of the protection layer 210; and etching back the sidewall spacer material layer until the top surface of the protection layer 210 and the top surface of the dummy gate dielectric layer 208 are exposed, to form the sidewall spacers 211.

A formation process of the sidewall spacer material layer may be one of chemical vapor deposition (CVD), physical vapor deposition (PVD), atomic layer deposition (ALD), heat treatment, or a combination thereof.

In one embodiment, the formation process of the sidewall spacer material layer is the atomic layer deposition process.

In one embodiment, before the sidewall spacers 211 are formed, the discretely arranged initial fins are connected by the connecting layer 206 to be a whole, which can avoid forming the sidewall spacer material on the sidewalls of the initial fins, and reduce the sidewall spacer material existing between the initial fins, thereby not only reducing formation difficulty of the sidewall spacers, but also reducing residue of the sidewall spacer material on the initial fins, so as to prepare for forming semiconductor devices with good quality.

Figure 11:
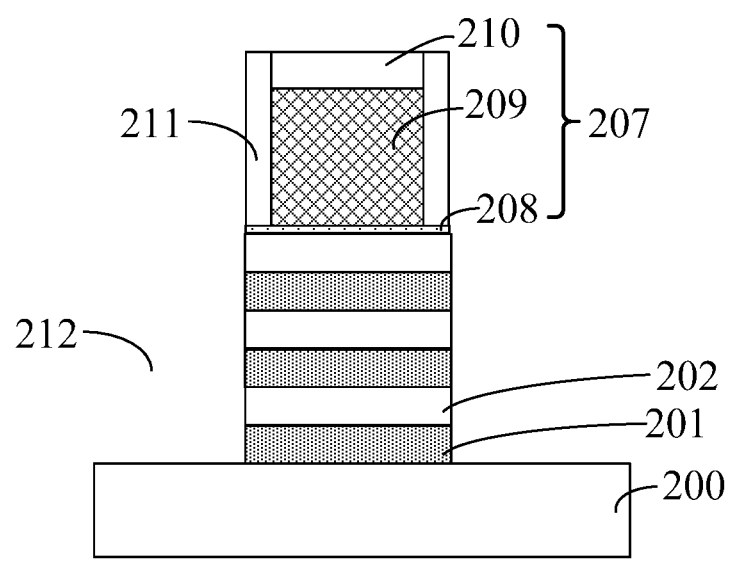

Referring to FIG. 11, view directions of FIG. 11 and FIG. 10 are the same. Grooves 212 are formed in the initial fins on both sides of the dummy gate structure 207 according to S05 in FIG. 19.

In one embodiment, a function of the grooves 212 is, on one hand, to provide spaces for source and drain doped layers to be formed later; and on another hand, to be ready to subsequently etch the sacrificial layers 201 covered by the dummy gate structure 207.

A process of etching the initial fins to form the grooves 212 includes an anisotropic dry etching process or an anisotropic wet etching process.

In one embodiment, the process of etching the initial fins is the anisotropic dry etching process. Parameters of the dry etching process include: an etching gas used including HBr and Ar, that a gas flow rate of HBr is between about 10 sccm and about 1000 sccm, and a gas flow rate of Ar is between about 10 sccm and about 1000 sccm.

In one embodiment, the initial fins are etched to form the grooves 212, and a bottom surface of the grooves 212 exposes the top surface of the substrate 200.

Figure 12:
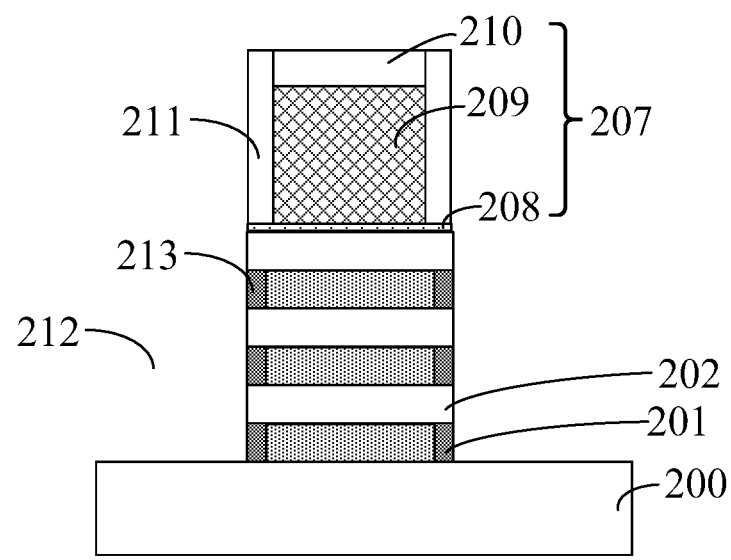

Referring to FIG. 12, a portion of the sacrificial layers 201 on sidewalls of the grooves 212 is etched, and barrier layers 213 are formed on sidewalls of the etched sacrificial layers 201.

In one embodiment, the barrier layers 213 are made of a material with a low dielectric constant, including at least one of SiOCN, SiOC, and SiON.

Sidewalls of the barrier layers 213 are flush with the sidewalls of the channel layers 202.

In one embodiment, the barrier layers 213 are made of a material including silicon nitride.

In one embodiment, the barrier layers 213 are formed for a purpose of forming electrical isolation between the source and drain doped layers formed subsequently and the gate structure to prevent punch-through between the two during use, thereby ensuring electrical properties of formed semiconductor devices.

Figure 13:
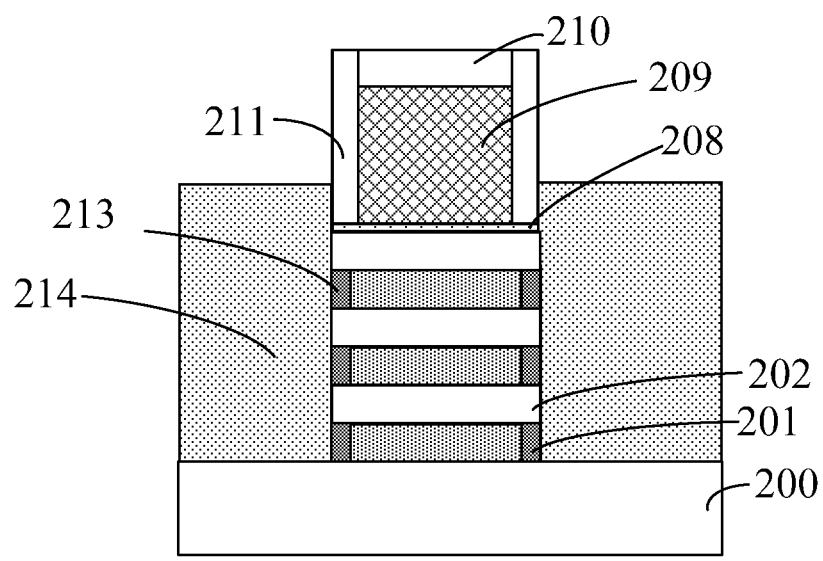

Referring to FIG. 13, source and drain doped layers 214 are formed in the grooves 212.

In one embodiment, a formation process of the source and drain doped layers 214 includes an epitaxial growth process. A process of doping source and drain ions in the source and drain doped layers 214 includes an in-situ doping process.

When a semiconductor structure is a P-type device, the source and drain doped layers 214 are made of a material including silicon, germanium, silicon germanium, or a combination thereof. The source and drain ions are P-type ions, including boron ions, $BF^{2-}$ ions, indium ions, or a combination thereof. When the semiconductor structure is an N-type device, the source and drain doped layers 214 are made of a material including silicon, gallium arsenide, indium gallium arsenide, or a combination thereof. The source and drain ions are N-type ions, including phosphorus ions, arsenic ions, or a combination thereof.

Figure 14:
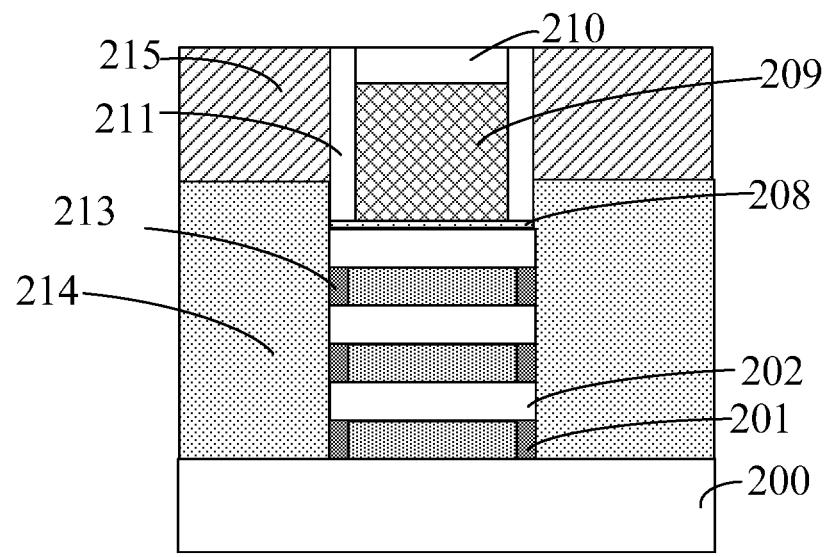

Referring to FIG. 14, a dielectric layer 215 is formed on the substrate 200 according to S06 in FIG. 19. The dielectric layer 215 covers the sidewalls of the dummy gate structure 207 and the source and drain doped layers 214. A top surface of the dielectric layer 215 is flush with a top surface of the dummy gate structure 207.

In one embodiment, after the source and drain doped layers 214 are formed, the dielectric layer 215 is formed on the substrate 200 and the isolation structure 203. The dielectric layer 215 is located on sidewalls of the sidewall spacers 211 and is flush with the top surface of the protection layer 210.

In one embodiment, the dielectric layer 215 is specifically formed on the isolation structure 203, and the dielectric layer 215 also covers the source and drain doped layers 214.

In one embodiment, a method for forming the dielectric layer 215 includes: forming an initial dielectric layer (not shown) on the substrate 200 and the isolation structure 203, that the initial dielectric layer covers the top surface and sidewall surfaces of the protection layer 210; and planarize the initial dielectric layer until the top surface of the protection layer 210 is exposed to form the dielectric layer 215.

In one embodiment, the dielectric layer 215 is made of a material including silicon oxide.

Figure 15:
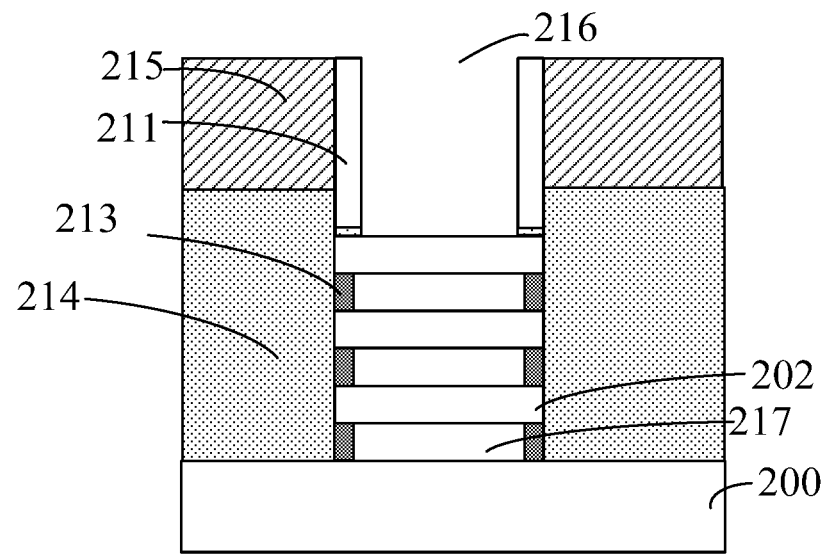
Figure 16:
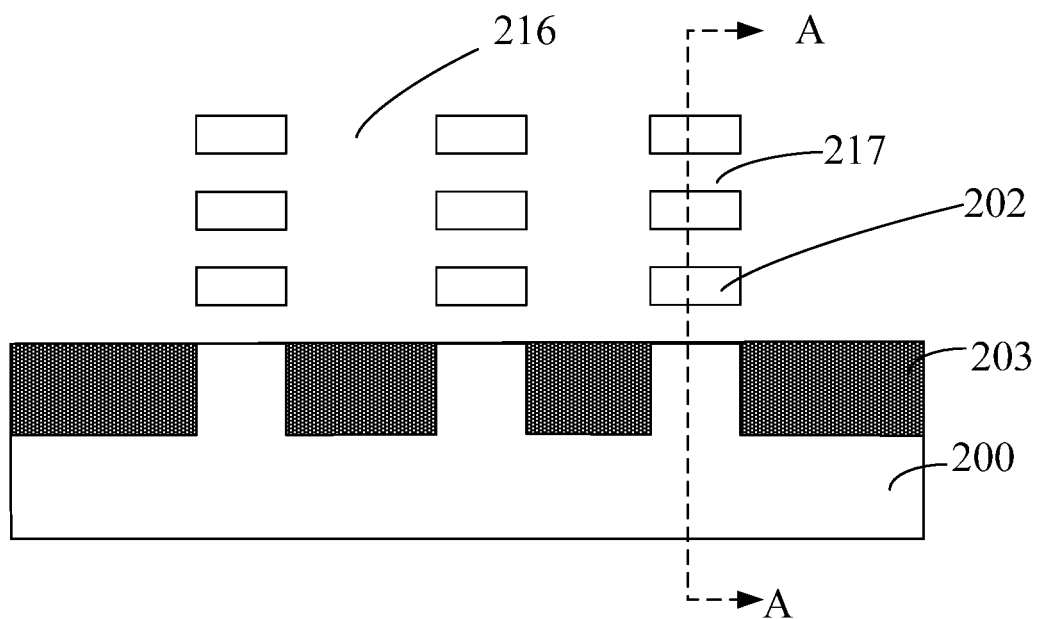

Referring to FIGS. 15 to 16, a view direction of FIG. 16 is the same as a view direction of FIG. 9. FIG. 15 is a cross-sectional view of FIG. 16 along a line A-A. The dummy gate structure 207, the sacrificial layers 201 under the dummy gate structure 207, and the connecting layer 206, are removed to form a gate opening 216 and conduits 217 according to S07 in FIG. 19. The conduits 217 are located between adjacent channel layers 202 and between the channel layers 202 and the substrate 200.

In one embodiment, the dummy gate structure 207 is removed, and the gate opening 216 is formed in the dielectric layer 215.

In one embodiment, a process for removing the dummy gate structure 207 is a wet etching process, and alternatively, tetramethylammonium hydroxide (TMAH) is used as an etching solution.

In one embodiment, the dummy gate structure 207 is removed to form the gate opening 216, to expose the sacrificial layers 201 and the connecting layer 206 covered by the dummy gate structure 207.

In one embodiment, a process of removing the sacrificial layers 201 and the connecting layer 206 covered by the dummy gate structure 207 is a wet etching process, and alternative process parameters include: a temperature of about 25° C. to about 300° C., and HCl gas with a volume percentage of about 20% to about 90%.

In one embodiment, the dummy gate structure 207, and the sacrificial layers 201 and the connecting layer 206 covered by the dummy gate structure 207, are removed to prepare for subsequent formation of the gate structure.

In one embodiment, due to existence of the connecting layer 206, the dummy gate structure 207 is not formed between adjacent initial fins, so that in the process of removing the dummy gate structure, residue of the dummy gate structure 207 will not be caused due to the small spacings between the initial fins, thereby reducing difficulty of removing the dummy gate structure 207 and improving quality of removing the dummy gate structure 207, to prepare for forming the gate structure with high quality.

In one embodiment, since the plurality of discretely arranged initial fins are connected by the connecting layer 206, the plurality of discrete initial fins is regarded as a whole, there is no need to consider impact of the spacings between the initial fins on subsequent processes, thereby reducing difficulty of subsequent process formation, having a wide range of applications, and being more suitable for manufacturing of semiconductor devices with smaller sizes.

Figure 17:
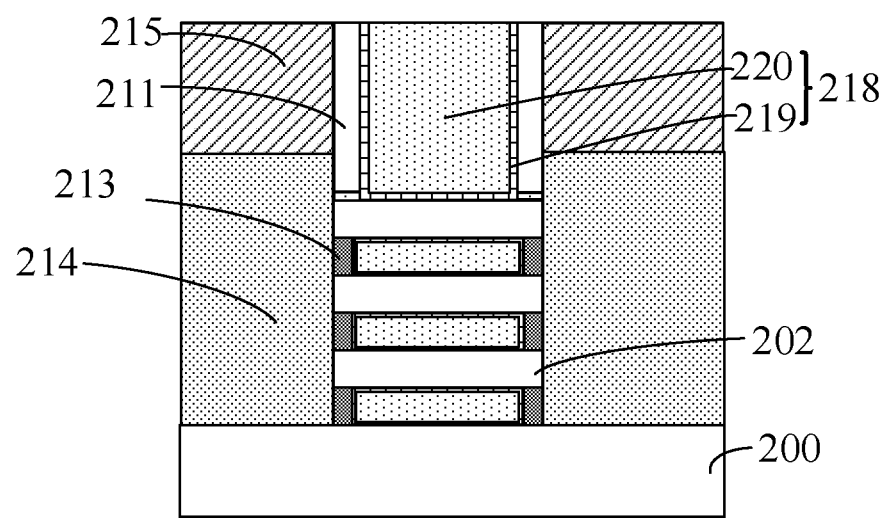
Figure 18:
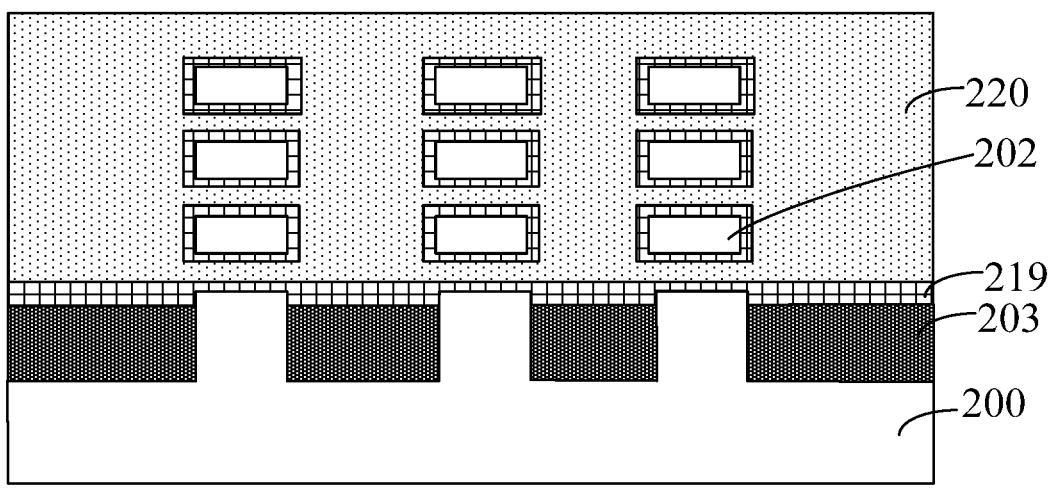

Referring to FIGS. 17 to 18, a gate structure 218 is formed in the gate opening 216 and the conduits 217. The gate structure 218 fills the gate opening 216 and the conduits 217, and surrounds the channel layers 202.

In one embodiment, the gate structure 218 includes a gate dielectric layer 219 and a gate electrode layer 220 located on the gate dielectric layer.

In one embodiment, the gate dielectric layer 219 is made of a high-k dielectric material (a dielectric coefficient k greater than 3.9). The high-k dielectric material includes at least one of hafnium oxide, zirconium oxide, hafnium silicon oxide, lanthanum oxide, zirconium silicon, titanium oxide, tantalum oxide, barium strontium titanium oxide, barium titanium oxide, strontium titanium oxide, aluminum oxide, or a combination thereof.

In one embodiment, the gate electrode layer 220 is made of a material including a metal, and the metal material includes one of copper, tungsten, nickel, chromium, titanium, tantalum, aluminum, or a combination thereof.

In one embodiment, the gate structure 218 surrounds circumferences of the channel layers 202, so that control ability of the gate structure 218 on the channels is enhanced, and a maximum effective width of the gate structure 218 is ensured, thereby improving the performance of the formed semiconductor device.

Although the present disclosure is disclosed as above, the present disclosure is not limited to this. Any person skilled in the art can make various changes and modifications without departing from the spirit and scope of the present disclosure. Therefore, the protection scope of the present disclosure shall be subject to the scope defined by the claims.

What is claimed is:

1. A fabrication method of a semiconductor device, comprising:
   providing a plurality of initial fins discretely arranged on a substrate;
   forming an isolation structure on the substrate and between adjacent initial fins;
   forming a connecting layer on sidewalls of the plurality of initial fins and between adjacent initial fins, a top surface of the connection layer being coplanar with a top surface of the plurality of initial fins;
   forming a dummy gate structure across the plurality of initial fins and the connecting layer on the substrate, wherein the dummy gate structure covers sidewalls of the connecting layer and a portion of the top surface of the plurality of initial fins;
   forming grooves in the plurality of initial fins on both sides of the dummy gate structure, and forming source and drain doped layers in the grooves;
   forming a dielectric layer on the substrate, wherein the dielectric layer covers sidewalls of the dummy gate structure and the source and drain doped layers, and a top surface of the dielectric layer is flush with a top surface of the dummy gate structure; and
   removing the dummy gate structure to form a gate structure.

2. The method according to claim 1, wherein:
   the connecting layer is made of a material including silicon germanium, amorphous carbon, amorphous germanium, or a combination thereof.

3. The method according to claim 1, wherein:
   a process of forming the connecting layer is a chemical vapor deposition process, an atomic layer deposition process, a physical vapor deposition process, or an epitaxial growth process.

4. The method according to claim 1, wherein forming the connecting layer includes:
   forming an initial connecting layer on the substrate, on the sidewalls and tops of the plurality of initial fins, and between adjacent initial fins; and
   etching back the initial connecting layer to expose the substrate and the top surface of the plurality of initial fins to form the connecting layer.

5. The method according to claim 4, wherein:
   a process of etching back the initial connecting layer is a dry etching process, or a wet etching process.

6. The method according to claim 1, wherein providing the plurality of initial fins discretely arranged on the substrate includes:
   forming a patterned layer on the substrate; and
   using the patterned layer as a mask, etching a portion of a thickness of the substrate to form the plurality of initial fins discretely arranged on the substrate.

7. The method according to claim 1, wherein providing the plurality of initial fins discretely arranged on the substrate includes:
   forming sacrificial layer films and channel layer films alternately stacked on the substrate, wherein the channel layer films are located between adjacent two sacrificial layer films and on a top sacrificial layer film;
   forming a patterned layer on a top channel layer film; and
   using the patterned layer as a mask, etching the channel layer films, the sacrificial layer films, and a portion of a thickness of the substrate, to form the plurality of initial fins on the substrate, wherein the plurality of initial fins includes sacrificial layers and channel layers alternately stacked along a normal direction of a surface of the substrate, and the channel layers are located between two adjacent sacrificial layers and on a top sacrificial layer.

8. The method according to claim 7, wherein removing the dummy gate structure to form the gate structure includes:
   removing the dummy gate structure, the sacrificial layers under the dummy gate structure, and the connecting layer, to form a gate opening and conduits, wherein the conduits are located between adjacent channel layers and between the channel layers and the substrate; and
   forming the gate structure in the gate opening and the conduits, wherein the gate structure fills the gate opening and the conduits, and surrounds the channel layers.

9. The method according to claim 8, wherein:
the gate structure includes a gate dielectric layer and a gate electrode layer on the gate dielectric layer.

10. The method according to claim 9, wherein:
the gate dielectric layer is made of a high-k dielectric material including at least one of hafnium oxide, zirconium oxide, hafnium silicon oxide, lanthanum oxide, zirconium silicon, titanium oxide, tantalum oxide, barium strontium titanium oxide, barium titanium oxide, strontium titanium oxide, aluminum oxide, or a combination thereof.

11. The method according to claim 9, wherein:
the gate electrode layer is made of a material including a metal including one of copper, tungsten, nickel, chromium, titanium, tantalum, aluminum, or a combination thereof.

12. The method according to claim 1, wherein before forming the connecting layer, the method further includes:
forming a hard mask layer on tops of the plurality of initial fins.

13. The method according to claim 12, wherein after forming the connecting layer, the method further includes:
removing the hard mask layer.

14. The method according to claim 12, wherein:
the hard mask layer is made of a material including silicon nitride, silicon oxide, silicon carbide, or a combination thereof.

15. The method according to claim 7, wherein before forming the source and drain doped layers, the method further includes:
etching a portion of the sacrificial layers on sidewalls of the grooves, to form barrier layers on sidewalls of the etched sacrificial layers.

16. The method according to claim 7, wherein:
a top surface of the isolation structure is flush with a bottom surface of a bottom sacrificial layer.

17. The semiconductor device fabricated by the method according to 1, comprising:
the substrate;
the plurality of fins discretely arranged on the substrate; and
the gate structure across the plurality of fins.

18. The device according to claim 17, wherein:
the gate structure includes a gate dielectric layer and a gate electrode layer on the gate dielectric layer, and
each of the one or more channel layers is surrounded by the gate dielectric layer and further surrounded by the gate electrode layer.

19. A fabrication method of a semiconductor device, comprising:
providing a plurality of initial fins discretely arranged on a substrate;
forming an isolation structure on the substrate and between adjacent initial fins;
forming a connecting layer on sidewalls of the plurality of initial fins and between adjacent initial fins, including:
forming an initial connecting layer on the substrate, on the sidewalls and tops of the plurality of initial fins, and between adjacent initial fins; and
etching back the initial connecting layer to expose the substrate and the top surface of the plurality of initial fins to form the connecting layer;
forming a dummy gate structure across the plurality of initial fins and the connecting layer on the substrate, wherein the dummy gate structure covers sidewalls of the connecting layer and a portion of a top surface of the plurality of initial fins;
forming grooves in the plurality of initial fins on both sides of the dummy gate structure, and forming source and drain doped layers in the grooves;
forming a dielectric layer on the substrate, wherein the dielectric layer covers sidewalls of the dummy gate structure and the source and drain doped layers, and a top surface of the dielectric layer is flush with a top surface of the dummy gate structure; and
removing the dummy gate structure to form a gate structure.

20. A fabrication method of a semiconductor device, comprising:
providing a plurality of initial fins discretely arranged on a substrate, including:
forming sacrificial layer films and channel layer films alternately stacked on the substrate, wherein the channel layer films are located between adjacent two sacrificial layer films and on a top sacrificial layer film;
forming a patterned layer on a top channel layer film; and
using the patterned layer as a mask, etching the channel layer films, the sacrificial layer films, and a portion of a thickness of the substrate, to form the plurality of initial fins on the substrate, wherein the plurality of initial fins includes sacrificial layers and channel layers alternately stacked along a normal direction of a surface of the substrate, and the channel layers are located between two adjacent sacrificial layers and on a top sacrificial layer;
forming an isolation structure on the substrate and between adjacent initial fins;
forming a connecting layer on sidewalls of the plurality of initial fins and between adjacent initial fins;
forming a dummy gate structure across the plurality of initial fins and the connecting layer on the substrate, wherein the dummy gate structure covers sidewalls of the connecting layer and a portion of a top surface of the plurality of initial fins;
forming grooves in the plurality of initial fins on both sides of the dummy gate structure, and forming source and drain doped layers in the grooves;
forming a dielectric layer on the substrate, wherein the dielectric layer covers sidewalls of the dummy gate structure and the source and drain doped layers, and a top surface of the dielectric layer is flush with a top surface of the dummy gate structure; and
removing the dummy gate structure to form a gate structure, including:
removing the dummy gate structure, the sacrificial layers under the dummy gate structure, and the connecting layer, to form a gate opening and conduits, wherein the conduits are located between adjacent channel layers and between the channel layers and the substrate; and
forming the gate structure in the gate opening and the conduits, wherein the gate structure fills the gate opening and the conduits, and surrounds the channel layers.

* * * * *